(12) United States Patent
Hawkinson

(10) Patent No.: US 10,249,155 B1
(45) Date of Patent: Apr. 2, 2019

(54) SYSTEMS AND METHODS FOR MOUNTING LIGHT EMITTING DIODES FOR A VISUAL ALARM DEVICE IN MULTIPLE PLANES

(71) Applicant: Honeywell International Inc., Morristown, NJ (US)

(72) Inventor: Daniel Hawkinson, Elburn, IL (US)

(73) Assignee: Honeywell International Inc., Morris Plains, NJ (US)

(*) Notice: Subject to any disclaimer, the term of this patent is extended or adjusted under 35 U.S.C. 154(b) by 0 days.

(21) Appl. No.: 15/854,326

(22) Filed: Dec. 26, 2017

(51) Int. Cl.
| | |
|---|---|
| G08B 29/00 | (2006.01) |
| G08B 5/38 | (2006.01) |
| H05K 1/03 | (2006.01) |
| H05K 1/18 | (2006.01) |
| F21S 10/06 | (2006.01) |
| B60Q 1/26 | (2006.01) |
| G09F 9/33 | (2006.01) |

(52) U.S. Cl.
CPC .............. G08B 5/38 (2013.01); B60Q 1/2611 (2013.01); B60Q 1/2696 (2013.01); F21S 10/06 (2013.01); G09F 9/33 (2013.01); H05K 1/0393 (2013.01); H05K 1/18 (2013.01)

(58) Field of Classification Search
CPC ...... G08B 5/38; B60Q 1/2696; B60Q 1/2611; G09F 9/33; H05K 1/18; H05K 1/0393; F21S 10/06
USPC ...... 340/815.45, 506, 815.4, 815.47, 815.49, 340/691.1, 693.5
See application file for complete search history.

(56) References Cited

U.S. PATENT DOCUMENTS

| | | | |
|---|---|---|---|
| 5,585,783 A | 12/1996 | Hail | |
| 6,679,618 B1* | 1/2004 | Suckow | B60Q 1/2611 362/247 |
| 7,561,036 B2 | 7/2009 | Pederson | |
| 2005/0146884 A1* | 7/2005 | Scheithauer | B60Q 1/2611 362/470 |
| 2006/0132323 A1* | 6/2006 | Grady, Jr. | G08B 5/36 340/815.45 |
| 2007/0035255 A1 | 2/2007 | Shuster et al. | |
| 2011/0204393 A1* | 8/2011 | Masumoto | F21V 3/00 257/88 |
| 2014/0104054 A1* | 4/2014 | Weeks | B60Q 1/2611 340/468 |

FOREIGN PATENT DOCUMENTS

DE  102 39 347 A1  3/2004

OTHER PUBLICATIONS

English language translation of bibliographic data and abstract for DE10239347 (A1).
English language translation of description for DE10239347.
Enforcer LED Strobe Lights, Secro-Larm U.S.A., Inc., http://www.seco-larm.com/image/data/A_Documents/02_Manuals/Mi-SL-1301-xAQ_1604.pdf, accessed electronically on Sep. 1, 2017.

* cited by examiner

*Primary Examiner* — Anh V La
(74) *Attorney, Agent, or Firm* — Brooks, Cameron & Huebsch, PLLC

(57) ABSTRACT

Systems and methods for mounting light emitting diodes for a visual alarm device in multiple planes are provided. The visual alarm device can include a plurality of light emitting diodes (LEDs) mounted on a printed circuit board and configured to flash during an emergency situation, wherein each of the plurality of LEDs can be mounted in a respective one of a plurality of planes.

18 Claims, 5 Drawing Sheets

SYSTEMS AND METHODS FOR MOUNTING LIGHT EMITTING DIODES FOR A VISUAL ALARM DEVICE IN MULTIPLE PLANES

FIELD

The present invention relates generally to alarm devices. More particularly, the present invention relates to visual alarm devices.

BACKGROUND

Security systems are known to detect threats within a secured area, and such threats include events that represent a risk to human safety or a risk to assets.

Security systems typically include one or more security sensors that detect the threats within the secured area. For example, smoke, motion, and/or intrusion sensors are distributed throughout the secured area in order to detect the threats. Furthermore, security systems typically include notification appliances, such as sounders and visual alarm devices (i.e. strobe lights).

Standards organizations, such as Underwriters Laboratories (UL), specify standards for alarm devices. For example, UL 1638 specifies a light pattern for light emitted by a visual alarm device in a strobe light fire protection notification system.

Light patterns defined by known standards, such as UL 1638, are difficult to achieve. For example, known visual alarm devices that emit light patterns that comply with known standards (e.g. UL 1638) include a single light source and a complicated arrangement of lenses and reflectors. However, lenses and reflectors can add to a cost of the visual alarm device. Thus, there is a need for less expensive systems and methods that comply with known standards.

DETAILED DESCRIPTION

Figure 1:
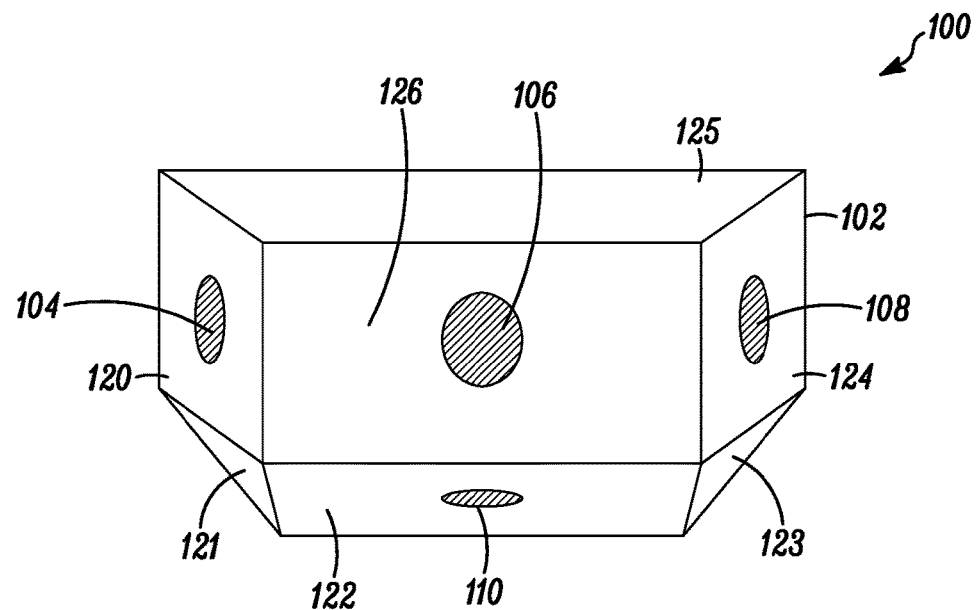
FIG. 1 is a perspective view of a visual alarm device in accordance with disclosed embodiments.

While this invention is susceptible of an embodiment in many different forms, there are shown in the drawings and will be described herein in detail specific embodiments thereof with the understanding that the present disclosure is to be considered as an exemplification of the principles of the invention. It is not intended to limit the invention to the specific illustrated embodiments.

Embodiments disclosed herein can include systems and methods for mounting a plurality of light emitting diodes (LEDs) for a visual alarm device in multiple planes on a single printed circuit board (PCB). For example, in some embodiments, the single PCB may comprise a flexible PCB, the plurality of LEDs can be mounted to the flexible PCB, and the flexible PCB can be mounted to a rigid frame or assembly. Furthermore, in some embodiments, the flexible PCB can flex to conform to a shape of the rigid frame or assembly such that each of the plurality of LEDs can be mounted in a respective one of a plurality of planes and oriented in a respective one of a plurality of directions to generate a light pattern. Further still, in some embodiments, each of the plurality of LEDs can be electrically coupled to one another via electrical components mounted to the flexible PCB.

In some embodiments, the visual alarm device can include four LEDs, and each of the four LEDs can be mounted in a respective one of four different planes. In some embodiments, the visual alarm device can include six LEDs, and each of the six LEDs can be mounted in a respective one of six different planes. In any embodiment, because the plurality of LEDs can be mounted in the multiple planes, reflectors or lenses are not required for the visual alarm device to emit the light pattern that complies with UL 1638 and other known standards.

FIG. 1 is a perspective view of a visual alarm device 100 in accordance with disclosed embodiments. As seen in FIG. 1, the visual alarm device 100 can include a flexible PCB 102, a plurality of LEDs 104-110 mounted on the flexible PCB 102, and a plurality of faces 120-125 of the visual alarm device 100. In some embodiments, wiring and circuitry may be printed on the flexible PCB 102 to electrically couple the plurality of LEDs 104-110 with one another, and in some embodiments, the visual alarm device 100 can be mounted to a wall or ceiling that can be substantially parallel with a front side of the plurality of faces 126. When seen from the perspective view of FIG. 1, the visual alarm device 100 can have a generally frustum shape.

In some embodiments, each of the plurality of LEDs 104-110 can be mounted in a respective one of a plurality of planes by, for exampling, flexing the flexible PCB 102 to orient each of the plurality of LEDs 104-110 in a respective one of a plurality of directions. For example, a first of the plurality of LEDs 104 can be mounted in a first of the plurality of planes defined by a first true side of the plurality of faces 120, a second of the plurality of LEDs 106 can be mounted in a second of the plurality of planes defined by the front side of the plurality of faces 126, a third of the plurality of LEDs 108 can be mounted in a third of the plurality of planes defined by a second true side of the plurality of faces 124, and a fourth of the plurality of LEDs 110 can be mounted in a fourth of the plurality of planes defined by a bottom side of the plurality of faces 120.

Figure 2:
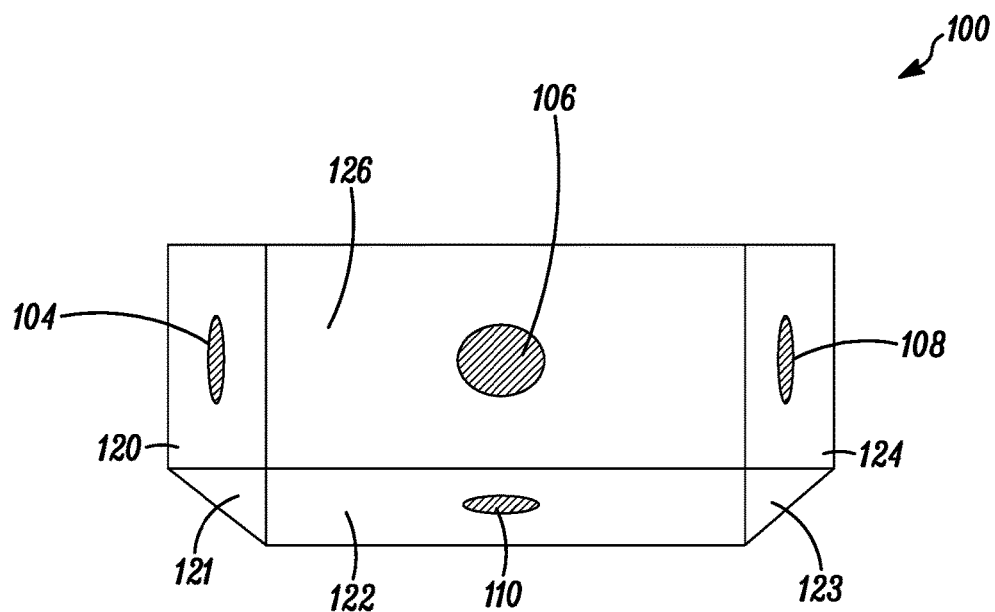
FIG. 2 is a front view of a visual alarm device in accordance with disclosed embodiments.

FIG. 2 is a front view of the visual alarm device 100 and shows the first true side of the plurality of faces 120, the front side of the plurality of faces 126, the second true side of the plurality of faces 124, a first downward side of the plurality of faces 121, a second downward side of the plurality of faces 123, a bottom side of the plurality of faces 122, the first of the plurality of LEDs 104, the second of the plurality of LEDs 106, the third of the plurality of LEDs 108, and the fourth of the plurality of LEDs 110. When seen from the front view of FIG. 2, the visual alarm device 100 can have a generally rectangular shape.

Figure 3:
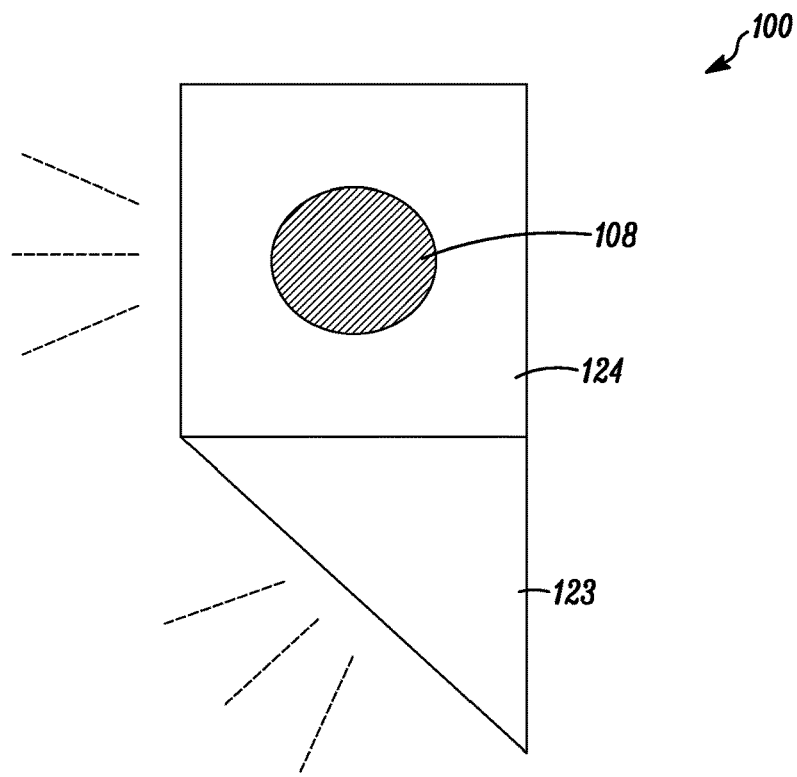
FIG. 3 is a side view of a visual alarm device in accordance with disclosed embodiments.

FIG. 3 is a side view of the visual alarm device 100 and shows the second true side of the plurality of faces 124, the second downward side of the plurality of faces 123, and the third of the plurality of LEDs 108. As seen in FIG. 3, a bottom half of the visual alarm detector 100 that includes at least the bottom side of the plurality of faces 122 can be angled downward to illuminate an area generally below the visual alarm device 100. Furthermore, in some embodiments one or both of the second true side of the plurality of faces 124 and the first true side of the plurality of faces 120 can be angled downward.

Figure 4:
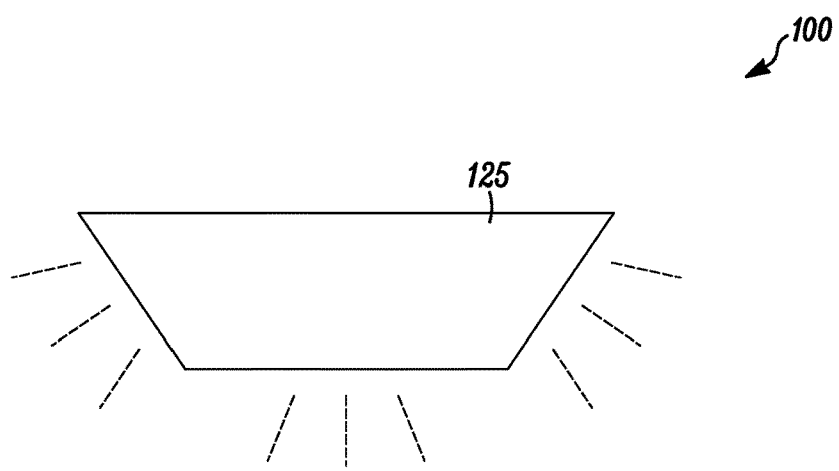
FIG. 4 is a top view of a visual alarm device in accordance with disclosed embodiments.

FIG. 4 is a top view of the visual alarm device 100 and shows a top side of the plurality of faces 125. When seen from the top view of FIG. 4, the visual alarm device 100 can have a generally trapezoidal shape. However, embodiments disclosed are not so limited, and it is to be understood that the visual alarm device 100 can be curved to have a half-circle shape or a half-ellipse shape. In some embodiments, the flexible PCB 102 may not cover the top side of the plurality of faces 125.

Figure 5:
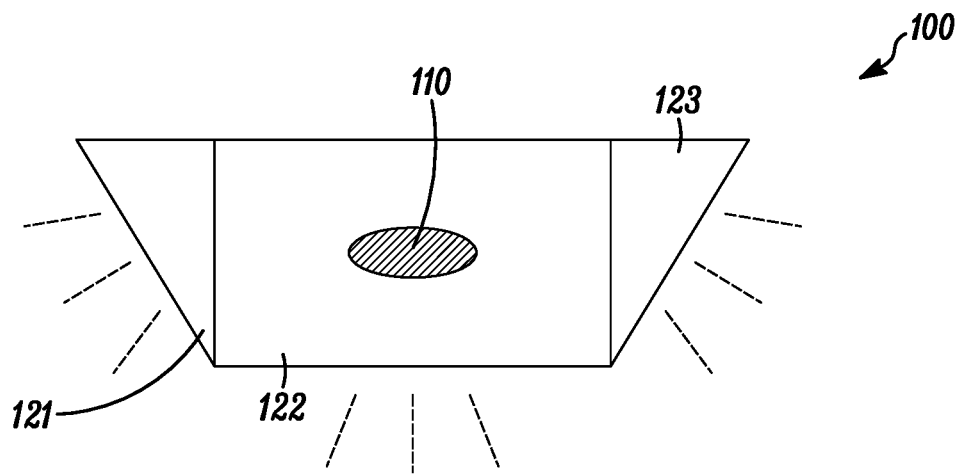
FIG. 5 is a bottom view of a visual alarm device in accordance with disclosed embodiments.

FIG. 5 is a bottom view of the visual alarm device 100 and shows the first downward side of the plurality of faces 121, the second downward side of the plurality of faces 123, the bottom side of the plurality of faces 122, and the fourth of the plurality of LEDs 110. When seen from the bottom view of FIG. 5, the visual alarm device 100 can have a generally trapezoidal shape. Furthermore, in some embodiments the first downward side of the plurality of faces 121, the second downward side of the plurality of faces 123, and the bottom side of the plurality of faces 122 can be angled downward.

Figure 6:
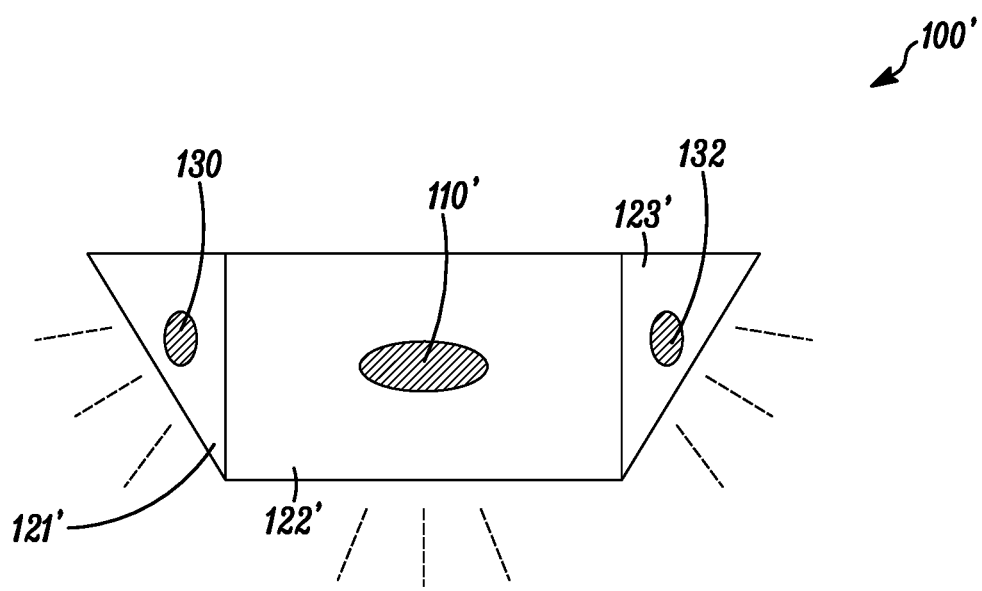
FIG. 6 is a bottom view of a visual alarm device in accordance with disclosed embodiments.

FIG. 6 is a bottom view of a visual alarm device 100' in accordance with disclosed embodiments and shows a first downward side of a plurality of faces 121', a second downward side of the plurality of faces 123', a bottom side of the plurality of faces 122', a fourth of a plurality of LEDs 110' mounted in a fourth of a plurality of planes defined by the bottom side of the plurality of faces 122', a fifth of the plurality of LEDs 130 mounted in a fifth of the plurality of planes defined by the first downward side of the plurality of faces 121', and a sixth of the plurality of LEDs 132 mounted in a sixth of the plurality of planes defined by the second downward side of the plurality of faces 123'.

Figure 7:
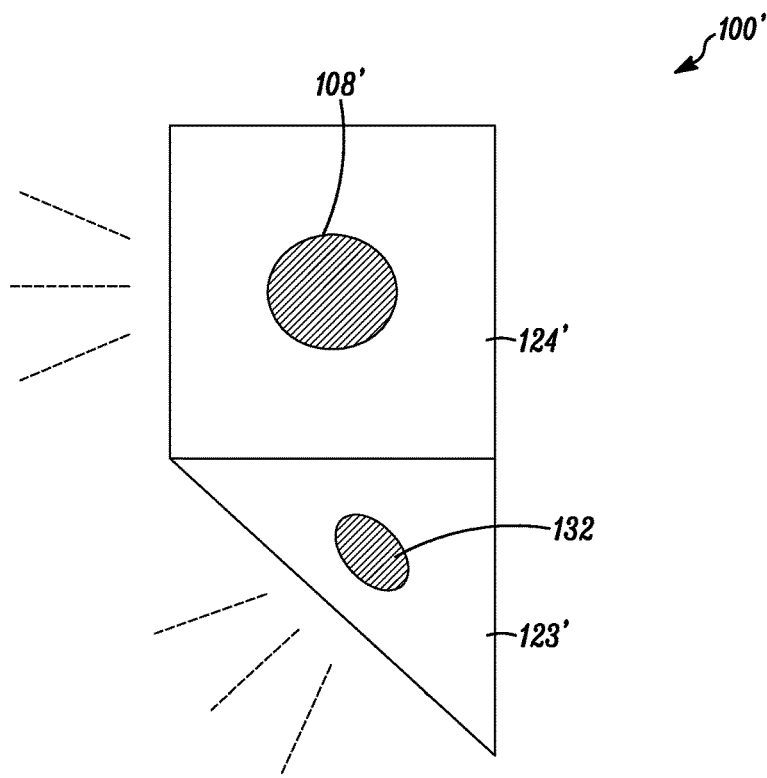
FIG. 7 is a side view of a visual alarm device in accordance with disclosed embodiments.

FIG. 7 is a side view of the visual alarm device 100' and shows a second true side of the plurality of faces 124', a second downward side of the plurality of faces 123', a third of the plurality of LEDs 108', and the sixth of the plurality of LEDs 132.

Figure 8:
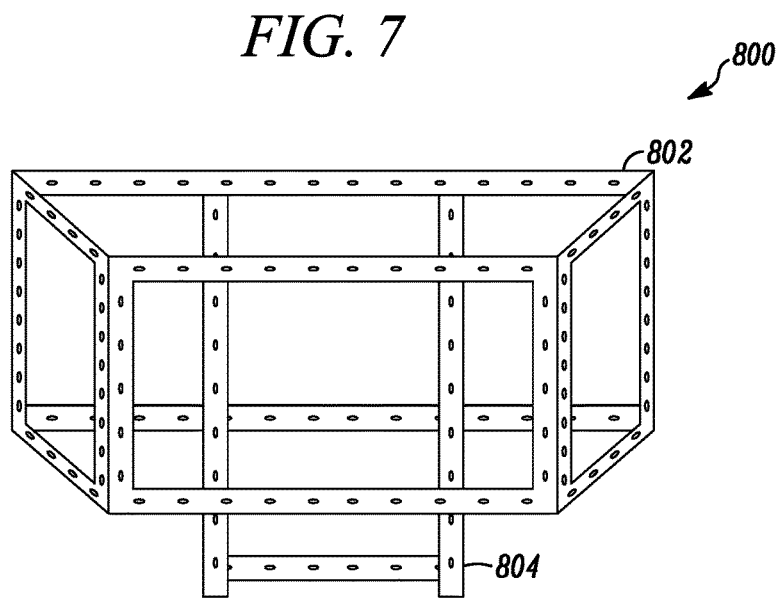
FIG. 8 is a perspective view of a frame of a visual alarm device in accordance with disclosed embodiments.

FIG. 8 is a perspective view of a frame 800 in accordance with disclosed embodiment. As seen in FIG. 8, the frame 800 can include a frustum frame assembly 802 and a back frame assembly 804. In some embodiments, the frustum frame assembly 802 may include a plurality of brackets and arms to define the plurality of faces 120, 124-126, and the frustum frame assembly 802 may include a generally frustum shape. Furthermore, in some embodiments, the back frame assembly 804 may include a generally rectangular shape and can be attached to the frustum frame assembly 804. In some embodiments, the back frame assembly 804 can be used to mount a visual alarm device to a wall or a ceiling. Furthermore, in some embodiments, an intersection between the frustum frame assembly 802 and the back frame assembly 804 may define the plurality of faces 120, 124-126. Further still, in some embodiments, the frustum frame assembly 802 and the back frame assembly 804 may flex the flexible PCB 102 to orient the plurality of LEDs 104-110, 104'-110', 130, 132 in the plurality of directions for mounting the plurality of LEDs 104-110, 104'-110', 130, 132 in the plurality of planes defined by the plurality of faces 120-126, 120'-126' of the visual alarm device 100, 100'.

Figure 9:
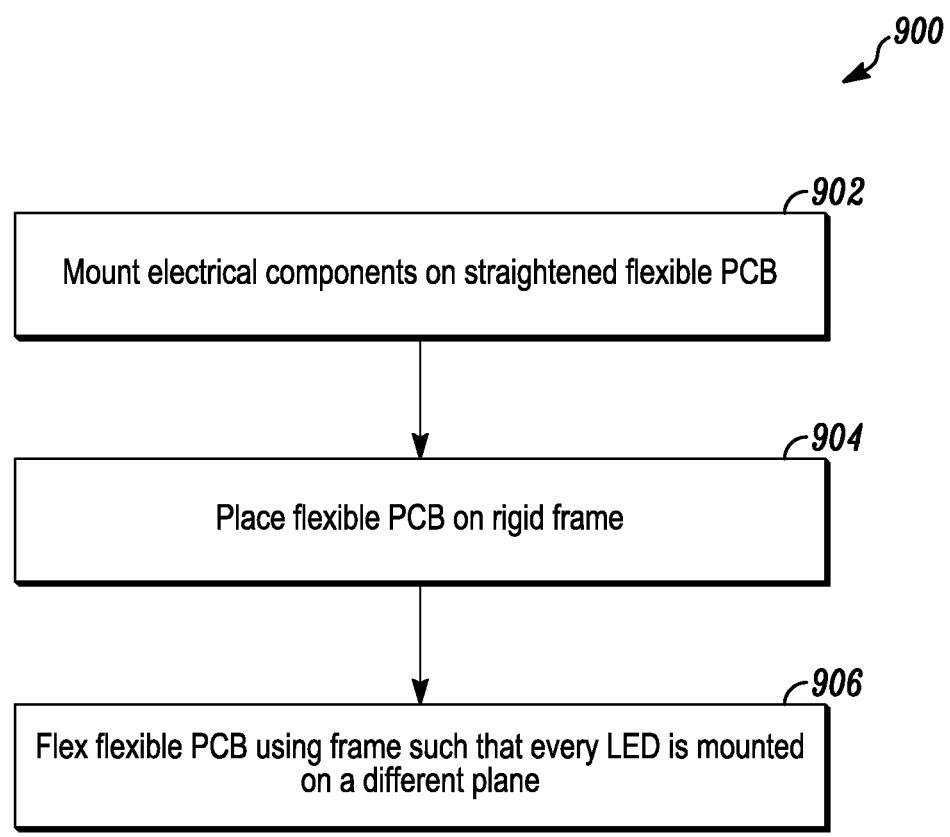
FIG. 9 is a flow diagram of a method in accordance with disclosed embodiments.

FIG. 9 is a flow diagram of a method 900 for forming a visual alarm device in accordance with disclosed embodiments. As seen in FIG. 9, the method 900 can include mounting electrical components (e.g. LEDs, wires, microprocessors, etc.) on a straightened or non-flexed flexible PCB (e.g. the PCB 102) as in 902, placing the flexible PCB over a rigid frame (e.g. the frame 800) as in 904, and using a shape of the rigid frame to flex the flexible PCB to orient a plurality of LEDs that are part of the electrical components in a plurality of directions for mounting the plurality of LEDs in a plurality of planes as in 906. Once connected electrically, each of the plurality of LEDs can flash simultaneously during an alarm or emergency situation.

Embodiments disclosed herein are described without a reflector, thereby minimizing cost. However, embodiments disclosed herein are not so limited and may include a lens or a reflector, for example, a reflector that can reflect upward-projected light, for example, LED light emitted in an upward direction, downward, thereby increasing efficiency and complying with UL 1638, which does not require light to be projected upward Although a few embodiments have been described in detail above, other modifications are possible. For example, the logic flows described above do not require the particular order described or sequential order to achieve desirable results. Other steps may be provided, steps may be eliminated from the described flows, and other components may be added to or removed from the described systems. Other embodiments may be within the scope of the invention.

From the foregoing, it will be observed that numerous variations and modifications may be effected without departing from the spirit and scope of the invention. It is to be understood that no limitation with respect to the specific system or method described herein is intended or should be inferred. It is, of course, intended to cover all such modifications as fall within the spirit and scope of the invention.

What is claimed is:

1. A visual alarm device comprising:
   a plurality of light emitting diodes (LEDs) mounted on a flexible printed circuit board (PCB) and configured to flash during an emergency situation,
   wherein each of the plurality of LEDs is mounted in a respective one of a plurality of planes, and
   wherein the visual alarm device has a generally trapezoidal shape when seen from above.

2. The visual alarm device of claim 1 further comprising a frame.

3. The visual alarm device of claim 2 wherein the frame includes a frustum frame assembly having a frustum shape and a back frame assembly.

4. The visual alarm device of claim 3 wherein the flexible PCB conforms to the frustum shape of the frustum frame assembly.

5. The visual alarm device of claim 4 wherein the plurality of LEDs includes four LEDs.

6. The visual alarm device of claim 5 wherein a first of the plurality of LEDs is mounted in a first of the plurality of planes defined by a first true side of a plurality of faces defined by the frustum shape.

7. The visual alarm device of claim 6 wherein a second of the plurality of LEDs is mounted in a second of the plurality of planes defined by a second true side of the plurality of faces defined by the frustum shape.

8. The visual alarm device of claim 7 wherein a third of the plurality of LEDs is mounted in a third of the plurality of planes defined by a front side of the plurality of faces defined by the frustum shape.

9. The visual alarm device of claim 8 wherein a fourth of the plurality of LEDs is mounted in a fourth of the plurality of planes defined by a bottom side of the plurality of faces defined by an intersection between the frustum frame assembly and the back frame assembly.

10. The visual alarm device of claim 4 wherein the plurality of LEDs includes six LEDs.

11. The visual alarm device of claim 10 wherein a first of the plurality of LEDs is mounted in a first of the plurality of planes defined by a first true side of a plurality of faces defined by the frustum shape, wherein a second of the plurality of LEDs is mounted in a second of the plurality of planes defined by a second true side of the plurality of faces defined by the frustum shape, wherein a third of the plurality of LEDs is mounted in a third of the plurality of planes defined by a front side of the plurality of faces defined by the frustum shape, wherein a fourth of the plurality of LEDs is mounted in a fourth of the plurality of planes defined by a bottom side of the plurality of faces defined by an intersection between the frustum frame assembly and the back frame assembly, and wherein a fifth of the plurality of LEDs is mounted in a fifth of the plurality of planes defined by a first downward side of the plurality of faces defined by the intersection between the frustum frame assembly and the back frame assembly.

12. The visual alarm device of claim 11 wherein a sixth of the plurality of LEDs is mounted in a sixth of the plurality of planes defined by a second downward side of the plurality of faces defined by the intersection between the frustum frame assembly and the back frame assembly.

13. The visual alarm device of claim 1 further comprising a reflector positioned above the plurality of LEDs.

14. The visual alarm device of claim 1 further comprising a lens.

15. The visual alarm device of claim 1 further comprising circuitry mounted on the flexible PCB to electrically interconnect the plurality of LEDs.

16. The visual alarm device of claim 15 wherein the plurality of LEDs flash synchronously.

17. A visual alarm device comprising:
a frame;
a flexible printed circuit board (PCB) flexed to conform to a shape of the frame; and
a plurality of light emitting diodes (LEDs) mounted on the flexible PCB and configured to flash during an emergency situation,
wherein each of the plurality of LEDs is mounted in a respective one of a plurality of planes, and
wherein the visual alarm device has a generally trapezoidal shape when seen from above.

18. A method comprising:
mounting a plurality of light emitting diodes (LEDs) on a straightened flexible printed circuit board (PCB);
placing the flexible PCB over a rigid frame; and
using a shape of the rigid frame to flex the flexible PCB to orient the plurality of LEDs in a plurality of directions for mounting the plurality of LEDs in a plurality of planes,
wherein the shape of the rigid frame is a generally trapezoidal shape when seen from above.

* * * * *